US010921184B2

(12) United States Patent
Alon et al.

(10) Patent No.: US 10,921,184 B2
(45) Date of Patent: Feb. 16, 2021

(54) STIMULATED RAMAN SCATTERING SPECTROSCOPE BASED ON PASSIVE Q-SWITCH AND USE THEREOF IN INDUSTRIAL MOLECULAR ANALYSIS

(71) Applicant: OPTIQGAIN LTD., Moshav Shahar (IL)

(72) Inventors: Ram Alon, Nir Banim (IL); Rotem Tzuk, Moshav Avigdor (IL)

(73) Assignee: OPTIQGAIN LTD., Moshav Shahar (IL)

( * ) Notice: Subject to any disclaimer, the term of this patent is extended or adjusted under 35 U.S.C. 154(b) by 0 days.

(21) Appl. No.: 16/487,197

(22) PCT Filed: Mar. 30, 2017

(86) PCT No.: PCT/IL2017/050393
§ 371 (c)(1),
(2) Date: Aug. 20, 2019

(87) PCT Pub. No.: WO2018/178964
PCT Pub. Date: Oct. 4, 2018

(65) Prior Publication Data
US 2020/0141799 A1    May 7, 2020

(51) Int. Cl.
| | |
|---|---|
| *G01J 3/44* | (2006.01) |
| *G01J 3/02* | (2006.01) |
| *G01J 3/10* | (2006.01) |
| *G01N 21/65* | (2006.01) |
| *H01S 5/00* | (2006.01) |
| *H01S 5/40* | (2006.01) |

(52) U.S. Cl.
CPC ............... *G01J 3/0218* (2013.01); *G01J 3/10* (2013.01); *G01J 3/44* (2013.01); *G01N 21/65* (2013.01); *H01S 5/0057* (2013.01); *H01S 5/4012* (2013.01); *H01S 5/4087* (2013.01); *G01N 2021/655* (2013.01)

(58) Field of Classification Search
CPC ..... G01J 3/44; G01N 21/65; G01N 2021/655; G01N 2021/6419; H01S 5/0057; H01S 5/4012; H01S 5/4087
See application file for complete search history.

(56) References Cited

U.S. PATENT DOCUMENTS

| | | | |
|---|---|---|---|
| 8,310,671 B1 | 11/2012 | Nguyen et al. | |
| 2012/0314724 A1* | 12/2012 | Peuser | ................ H01S 3/09415 |
| | | | 372/38.06 |

FOREIGN PATENT DOCUMENTS

WO        2015145429 A1    10/2015

OTHER PUBLICATIONS

Ward et al; "Real time monitoring of a biogas digester with gas chromatography, near-infrared spectroscopy, and membrane-inlet mass spectrometry", Bioresource Technology, vol. 102, No. 5, pp. 4098-4103. (2011).

(Continued)

*Primary Examiner* — Abdullahi Nur
(74) *Attorney, Agent, or Firm* — The Roy Gross Law Firm, LLC; Roy Gross

(57) ABSTRACT

The present application describes embodiments of a stimulated Raman scattering (SRS) spectroscope based on a passive Q-switch system for high-resolution, real-time, on-site and multi-point industrial molecular analysis.

19 Claims, 11 Drawing Sheets

(56) References Cited

OTHER PUBLICATIONS

Freudiger et al; "Label-Free Biomedical Imaging with High Sensitivity by Stimulated Raman Scattering Microscopy", Science, vol. 322, No. 5909, pp. 1857-1861. (2008).
International Search Report PCT/IL2017/050393 Completed Jul. 27, 2017; dated Jul. 31, 2017 4 pages.
Written Opinion of the International Searching Authority PCT/IL2017/050393 dated Jul. 31, 2017 7 pages.
Kredoncuff et al: "Probing moleculer symmerty with polarization-sensitive stimulated Raman Spectroscopy", Cornell University Library 2016.
Cantwll et al; "Development of laser-induced breakdoen spectroscopy sensor to assess groundwater quality impacts resulting from geologic carbon sequestration", Proceedings of SPIE, vol. 9467 pp. 94671K-94671K. (2015).
Bloch et al; "Filed test of a novel micro-aser-bases probe for in situ fluorescence sensing of soil contamination" Applied Spectrosopy vol. 52. No. 10 pp. 1299-1304. (1998).

\* cited by examiner

STIMULATED RAMAN SCATTERING SPECTROSCOPE BASED ON PASSIVE Q-SWITCH AND USE THEREOF IN INDUSTRIAL MOLECULAR ANALYSIS

RELATED APPLICATIONS

This application is a National Phase of PCT Patent Application No. PCT/IL2017/050393 having International filing date of Mar. 30, 2017. The contents of the above applications are all incorporated by reference as if fully set forth herein in their entirety.

TECHNICAL FIELD

The present application relates to a stimulated Raman scattering spectroscope comprising a passive Q-switch system, and use thereof for high-resolution, real-time and on-site molecular analysis in industrial applications.

BACKGROUND

The process industries, such as energy, oil & gas, chemicals and pharma are trillions of dollar businesses, characterised by complex processes, high capital expenditure and high operating expenses including various equipment, raw materials, energy and catalysts. With overall relatively low margins, these nowadays processes are inefficient, inflexible, polluting and are far from operating at their optimal zone. Improving efficiency of these industrial processes has a significant impact on profits and financial gains. The problem is that the improvement of the industrial processes is limited, due to inadequate process monitoring technologies, such as process sensors, chromatography and spectroscopy, which are unable to fulfil the industry's requirement for a combined high accuracy and real time molecular information.

As one of many examples of industrial processes, which need improvement and optimisation, is the operation of electric power plants world-wide using natural gas as their energy source. In the current global gas market, customers are supplied with gas from several sources (natural gas fields, gas shale production, liquefied natural gas, bio-gas). Real-time monitoring of the gas composition (input gas and output flue gas) improves turbine control and enables performance improvement, environmental protection and prevention of turbine damages. Gas turbines can accommodate a very large variation of energy sources, yet unpredictable changes in gas composition have the potential of damaging the turbines. In petrochemical processes, purity of the gases streamed into the reactors are critical for the final product quality. Small amount of contaminants may negatively affect the full batch, and therefore, the real-time monitoring may enable a better control on the inlet gases and prevent such negative effects.

Modern gas chromatographs are almost universally used to measure natural gas composition and its heating value. Ward et al (in *"Real time monitoring of a biogas digester with gas chromatography, near-infrared spectroscopy, and membrane-inlet mass spectrometry"*, Bioresource Technology 102, 2011, pp. 4098-4103) employed four methods for monitoring the anaerobic digestion process at a pilot scale. The methods employed for measurements of gases were membrane inlet mass spectrometry (MIMS) and micro gas chromatography (μ-GC). The μ-GC is a low maintenance method, whereas the MIMS requires frequent cleaning and background measurements. Being accurate, these methods are however extremely slow.

In attempt to overcome the above problem of the slow measurements with a gas chromatograph, G. E. Fodor (1996) under the contract to U.S. Army TARDEC Mobility Technology Center in Belvoir, Va. (Contract No. DAAK70-92-C-0059) developed the use of the mid-band Fourier-Transform Infrared Spectroscopy (FT-IR) as a rapid and rather reliable laboratory or field method to estimate natural gas composition and derived properties and to demonstrate the feasibility of the FT-IR as an on-line natural gas analyser. A very fast FT-IR experimental protocol was established for the simultaneous determination of methane, ethane, propane, and butane in nitrogen from the FT-IR spectra in real time. This method is based on correlations established between several known gas compositions and their FT-IR spectra. Nowadays, the FT-IR is widely used in industry. However, the conventional FT-IR instruments used for material detection and analysis in industrial applications are costly, require some experienced operators, cannot be applied directly to the gas lines, they are low-resolution and cannot distinguish between different molecule having similar absorption spectrum.

Spontaneous Raman transition spectroscopy has been used in industry for over twenty years getting attraction particularly in the last decade. Most analytes, including gases, possess a unique "Raman fingerprint" which can be used for their specific and very accurate detection and concentration measurements. Although it is a powerful tool for chemical and biochemical analysis providing specific vibrational signatures of chemical bonds, the Raman spectroscopy is however hampered by long acquisition time and is often hindered by low sensitivity that requires the use of high power lasers. In fact, it compromises between real-time measurements and resolution. Its performance is even more limited when low concentration target samples are being tested.

Stimulated Raman Scattering (SRS) belongs to a family of techniques based on the light scattering phenomenon first discovered and developed in the 1960s. Whereas the history of the technique is parallel to that of laser light sources, recent advances have spurred a resurgence in its use and development that has spanned across scientific fields and spatial scales. SRS is a nonlinear optical technique that probes the same vibrational modes of molecules that are seen in spontaneous Raman scattering. However, while spontaneous Raman scattering is an incoherent technique, SRS is a coherent process, and this fact provides several advantages over conventional Raman techniques.

The SRS spectroscopy utilises two monochromatic laser beams illuminating a sample and providing strong amplification at the vibrational transition rate, thereby increasing the Raman signal by several orders of magnitude. Its signal-to-noise ratio is several orders of magnitude better than that of the spontaneous Raman scattering. Technological improvements in pulse generation and detection strategies have allowed SRS to probe increasingly smaller volumes and shorter time scales. This has enabled SRS research to move from its original domain, of probing bulk media, to imaging biological tissues and single cells at the microscale, and, ultimately, to characterising samples with sub-diffraction resolution at the nanoscale. Thus, the SRS has a major advantage over the previous coherent Raman techniques in that the SRS method has a much better ability to time-resolve the vibrational motions. As a result, the SRS offers background-free and readily interpretable chemical contrast.

Freudiger et al (in "*Label-Free Biomedical Imaging with High Sensitivity by Stimulated Raman Scattering Microscopy*", Science 322, 2008, pp. 1857-1861) reported a three-dimensional multiphoton vibrational imaging technique based on the SRS spectroscopy providing much higher sensitivity than the spontaneous Raman spectroscopy. They demonstrated that sensitivity of the SRS imaging is significantly greater than that of the spontaneous Raman microscopy, because the former is achieved by implementing high-frequency (megahertz) phase-sensitive detection.

The two monochromatic lasers illuminating a sample in the SRS technique and thereby amplifying the Raman scattering are a Stokes laser with intensity $I_s$ and a pump laser with intensity $I_p$. The frequency difference of the two beams is defined as:

$$\Delta\omega = \omega_p - \omega_s,$$

wherein $\omega_p$ and $\omega_s$ signify the pump beam and the Stokes beam frequencies, respectively. When the frequency difference $\Delta\omega$ of the two monochromatic laser beams matches the natural frequency of vibration of a target molecule $\Omega$ or vibrational-rotational mode of a target molecule, stimulated excitation of a Raman mode transition takes place in the target molecule. The frequency of vibration $\Omega$ of a target molecule is equal to the spectral distance between the Stokes and the pump spectral lines in the Raman spectrum and represents a Raman shift unique to the target molecule.

The SRS spectroscopy provides very good performance with short acquisition times and low average power. When the condition $\Omega = \Delta\omega$ is met, the intensity of the pump field experiences a loss $\Delta I_p$ (SRL), while the Stokes field experiences a considerable gain $\Delta I_s$ (SRG), which means energy is transferred from one beam to another. The gain changes in the Raman scattering process of the laser beams (SRL or SRG) are proportional to the quantity of the target molecule in the sample. Therefore, the transferred energy expressed as SRL (or SRG) is directly proportional to the concentration of the target molecule in the sample, allowing for straightforward quantification.

In light of the above, it is clear that SRG or SRL signals can be used as unique vibrational contrast to specifically image target molecules. However, signals are rather weak ($\Delta I/I < 10^{-4}$, even lower than laser noise), and detecting them poses a significant challenge. In a small signal regime, when the intensity of SRG or SRL is relatively small, which means the ratio $\Delta I/I$ is much less than 1, $\Delta I_s$ and $\Delta I_p$, may be described by the following equations:

$$\Delta I_s \propto N \times \sigma(\text{Raman}) \times I_p \times I_s \quad (1)$$

$$\Delta I_p \propto -N \times \sigma(\text{Raman}) \times I_p \times I_s \quad (2)$$

where $\Delta I$ refers to the change in intensity I of the pump and Stokes laser beams, $\Delta I_p$ and $\Delta I_s$ respectively, where I is the intensity of the pump and Stokes laser beams $I_p$, and $I_s$, respectively; N is the number of molecules in the probed/tested volume, and $\sigma(\text{Raman})$ is the molecular Raman scattering cross-section. In order to acquire high resolution molecular measurements where the number of molecules in the tested volume is very low, it is clear from Equation (1) that the product $I_p \times I_s$ should be very high. It means the irradiances or irradiation intensities, defined as radiant power received by a surface per unit area, of the pump and the Stokes laser, $I_p$ and $I_s$ respectively, should be very high. However, the noise in the system is also proportional to the product $I_p \times I_s$. Therefore, in cases of very low molecular concentrations where $\Delta I$ is considerably lower than $\Delta I/I$, the signal-to-noise ratio denoted by $\Delta I/n$ (n being a noise signal) is very low.

From the above, it is readily understood that the challenges that must be dealt with when using a SRS spectrophotometer system in the low concentration regime are low signal-to-noise ratio and poor analogue-to-digital conversion, which means the measured signal ($I_p$ or $I_s$) may be high while the actual signal ($\Delta I$) corresponding to the particular molecule is very low. As mentioned above, in the SRS technique, the gain of the Raman scattering is proportional to the electro-optical field intensity of the pump and the Stokes beams. Also, the results are highly dependent on the accuracy of the wavelength difference of the beams.

In order to achieve high resolution spectral measurements of target molecules, the SRS spectroscopy systems must use lasers with narrow spectral width, high peak power and femto- or picosecond pulse duration. When the laser intensity is relatively low, the beam diameter is reduced to maintain a minimum irradiance of about 10 megawatt/cm² needed for each SRS laser beam. Wide range tunable lasers are used to acquire a wide range Raman spectrum. A high level of wavelength and amplitude stabilisation is required in that case. In addition, very fast and very complex, high resolution photodetectors and real-time noise reduction techniques must be used. All this leads to extremely complicated and very expensive implementation, which may be suitable mainly for sophisticated university laboratories and research institutes. The SRS is typically implemented in the near-infra-red (NIR) region of the electromagnetic spectrum (600-1000 nm) where other physical spectrometric phenomena, such as fluorescence or phosphorescence, have low expression and the molecular Raman scattering cross-section $\sigma(\text{Raman})$ is high. These two factors result in a high "built-in" signal-to-noise ratio. Of particular importance is water molecules present in most materials and having virtually no fluorescence in the NIR region indicated above.

Current solutions for managing the relatively low signal-to-noise ratio and poor resolution of the SRS systems require using high-peak power, narrow spectral-emission widths, very stable and accurate, optical components with low noise, such as photodiodes and laser sources, together with high resolution, low-noise analogue-to-digital converters. However, these components are expensive and in many cases must be custom made. Moreover, the system's architecture is overly complicated, bulky, relatively delicate and difficult to align or maintain alignment. It also cannot be used outdoors. Alternatively, there are various and commercially available lasers which are less accurate, inherently unstable, express high background and subject to wavelength drift. Devising a method of using such unstable lasers in the SRS spectroscopy could significantly lower cost, instrument size and increase system robustness. However, for this reason and in spite of the aforementioned advantages of the SRS over other techniques used in molecular analysis, the use of the SRS has not been implemented in industry yet.

As mentioned above, the SRS spectroscopic instruments are currently used only in the academic institutions. However, it has been a long-felt need to create a relatively small in size, robust and capable of operating in industrial environments, device for on-line, real-time, high-resolution monitoring of gases and other materials on a molecular level in industrial processes. A robust, real-time, high-resolution industrial molecular analyser directly sampling tens of intermittent stages of the industrial plant processes, taking into account safety precautions in various aggressive, hazardous and explosive environments, whilst performing the completely automatic analysis with relatively low maintenance cost (no moving parts, no consumables and high durability) is highly desirable. Such device disclosed in the present application, used for real-time control and massive data collection of industrial processes, through real-time response and high-resolution monitoring of the target molecules composition, is suitable for on-field, industrial conditions in a wide range of temperatures and monitoring conditions, including corrosive environments, high noise and vibrations.

SUMMARY

The present application describes embodiments of a stimulated Raman scattering (SRS) spectroscope for high-resolution, real-time, on-site and multi-point industrial molecular analysis of a sample, comprising:
(a) a laser generator subsystem comprising a first laser capable of generating a first laser beam (a pump signal) having a relatively low power, and a second laser capable of generating a second laser beam having a wavelength that matches the input of a passive Q-switch crystal, and transmitting said two laser beams into a passive detection probe subsystem via optical fibres, wherein the spectral difference wavelength between said first laser beam and said passive Q-switch crystal matches the excitation Raman wavelength of a target analyte in said sample;
(b) at least one passive detection probe subsystem comprising:
  (1) said passive Q-switch crystal, capable of receiving said second laser beam and generating high-power short pulses of a Stokes signal from said second laser beam, and
  (2) a beam combiner unit capable of combining said high-power short pulses of said Stokes signal with said first low-power laser beam into a mixed laser beam, transmitting 5-10% of said mixed laser beam (a reference laser beam) to a receiver subsystem via an optical fibre or through free space optics, transmitting the rest 90-95% of said mixed laser beam into a detection cell containing said sample, and further transmitting the resulting laser beam after passing said detection cell to said receiver subsystem via another optical fibre or through free space optics;
(c) the receiver subsystem capable of capturing said reference laser beam and said resulting laser beam onto an optical frontend connected to an analogue frontend, converting said two laser beams to an analogue signal at said analogue frontend, converting said analogue signal to a digital signal, improving a signal-to-noise ratio, generating the SRS data for said sample, and outputting said SRS data to a computing unit; and
(d) the computing unit capable of collecting, analysing and displaying said SRS data in a readable format, controlling said SRS spectroscope, calculating molecular composition of the sample and concentration of the target analyte in said sample, obtained from said SRS data using a concentration algorithm, and transmitting the obtained calculation results to a process control system for improving and optimising the process via real-time close loops or via massive data collection and big data analysis;
wherein
(i) said laser generator subsystem is distant from said passive detection probe system, said distance is determined by safety and design requirements in analysis of said sample;
(ii) said passive detection probe subsystem is purely optical and contains no electronic components;
(iii) said high-power short pulses of the Stokes signal are generated using said passive Q-switch crystal in a close proximity to said detection cell, and filtered out at the exit from said detection cell;
(iv) said receiver subsystem is asynchronous with respect to said laser generator subsystem, detecting the SRS signal at the exact pre-defined timing independent of capturing said laser beams, thereby improving the overall signal-to-noise ratio and obviating the need for signal transduction from said laser generator subsystem;
(v) said high-power Stokes signal is used as an acquisition clock for detection (clocking) of said SRS signal and removal of a fundamental jitter, thereby obviating the need for tracking said jitter in said SRS spectroscope; and
(vi) said SRS data is collected as a lost signal in said low-power pump signal, which is symmetric to said high-power Stokes signal, thereby obviating the need for synchronisation of said signals.

In other words, the low-power pump signal is "blindly" detected based on said pre-defined timing from said high-power Stokes signal (clock). The high-power Stokes signal having very high intensity is easily detectable by the receiver, but has a relatively short lifetime of about 500 picoseconds (ps), which makes it challenging to use it as a clock for the upcoming but almost invisible, deeply buried in the noise, lower-power pump signal. Therefore, in another embodiment, the Stokes signal is electronically processed to increase its lifetime to about 5 microseconds (µs). Such wide digital signal does not require expensive electronics for clocking the pump signal.

In a further embodiment, said first laser is one or more tunable laser diodes or a combination of one or more tunable laser diodes and one or more fixed-wavelength laser diodes. Said first laser may be an array of fixed-wavelength laser diodes, capable of generating laser beams having different wavelengths and being activated in a predefine sequence for selecting a particular fixed-wavelength laser diode from said array for generating said first laser beam, wherein at a certain time, only one of said fixed-wavelength laser diodes is selected to transmit said first laser beam into said passive detection probe subsystem.

In a particular embodiment, said second laser is an 808-manometers (nm) laser diode having power in the range of 2-20 Watt and capable of generating the second laser beam passing through the passive Q-switch crystal and thereby resulting in 1064-nm high-power short pulses of a Stokes signal.

The SRS spectroscope of an embodiment may further comprise a central processing unit capable of tuning said tunable laser diode to a predefine set of wavelengths, and/or an optical switch capable of fast switching between said fixed-wavelength laser diodes in said array in a predefine sequence, and/or a central processing unit capable of controlling said optical switch and selecting a particular fixed-wavelength laser diode from said array for generating said first laser beam, wherein the spectral difference wavelength between said first laser beam and said passive Q-switch crystal matches the excitation Raman wavelength of a target analyte in said sample.

The SRS spectroscope of the preceding embodiment may further comprise an additional optical switch capable of directing said generated first laser beam into the passive detection probe subsystem. In an exemplary embodiment, said optical switch may be a 2×2N micro-electromechanical system (MEMS) mux, which is capable of directing said laser beams to more than one probe, where N is the number of the probes.

In yet further embodiment, said optical fibre transmitting said first laser beam (the pump signal) into said passive detection probe subsystem is a single-mode optical fibre or a polarisation-maintaining optical fibre, said optical fibre transmitting said second laser beam (the input signal to the Q-switch crystal) into said passive detection probe subsystem is a multi-mode optical fibre, and said optical fibres connecting said passive detection probe subsystem to said receiver subsystem are multi-mode optical fibres.

The SRS spectroscope of an embodiment may comprise more than one passive detection probe subsystem for testing more than one sample, and may comprise two optical switches capable of switching between said passive detection probe subsystems and selecting a particular passive detection probe subsystem for conducting the test on a specific target analyte. In a particular embodiment, one of said passive detection probe subsystems is used for calibration. In another particular embodiment, a first one of said optical switches is a single-mode and polarisation-maintaining MEMS mux and a second one of said optical switches is a multimode MEMS mux.

In another embodiment, said passive detection probe subsystem may comprise:
(1) a passive Q-switch crystal capable of receiving said second laser beam and generating high-power short pulses of the Stokes signal from said second laser beam;
(2) a beam combiner unit capable of combining said high-power short pulses of said Stokes signal with said first laser beam into a mixed laser beam, transmitting 5-10% of said mixed laser beam (a reference laser beam) directly to the optical frontend of the receiver subsystem via a multi-mode optical fibre and transmitting the rest 90-95% of said mixed laser beam to a detection cell containing said sample; and
(3) the detection cell connected via multi-mode optical fibre to the optical frontend of the receiver subsystem, and capable of receiving said 90-95% of said mixed laser beam and said sample of the target analyte from an external source, wherein said detection cell is sequentially irradiated by said 90-95% of said mixed laser beam.

In a specific embodiment, said detection cell described in the preceding embodiment further comprises a set of lenses or mirrors and collimation lenses. Said detection cell of the SRS spectroscope of an embodiment may comprise a multi-pass unit improving detection sensitivity by increasing the total optical path length that travels through the sample volume, or a single-pass unit. In another specific embodiment, the distance between said laser generator subsystem and said passive detection probe system is in the range of 10-500 m, while the distance between said detection cell and said receiver subsystem is in the range of 10 cm to 50 m.

In still another embodiment, said receiver subsystem may comprise:
(1) the optical frontend connected via multi-mode optical fibres or optically through space to said detection cell, and containing a plurality of photodetectors adapted and configured for receiving the reference and resulting laser beams, splitting said reference and resulting laser beams into pump and Stokes laser beams and directing them to the analogue frontend;
(2) the analogue frontend capable of converting said reference and resulting laser beams into corresponding analogue signals and directly providing said analogue signals to a digital board;
(3) the digital board comprising a plurality of analogue-to-digital convertors (ADCs) for converting said analogue signals to digital signals, one or more analogue filters for analogue processing, a programmable or automatic gain control circuit, and one or more digital signal converters, for example pulse to transistor-transistor logic (TTL) converters, for converting the Stokes pulses to the digital signals (the TTL pulses in the present example) and using the latter as triggers for the ADCs; and
(4) a computing unit comprising a digital signal processor (DSP) and/or central processing unit (CPU) capable of receiving the digital signals from said ADCs, processing and calibrating them, and generating a SRS spectrum from said processed digital signals.

The SRS spectroscope of an embodiment comprising a passive Q-switch crystal may be used for real-time molecular level monitoring, real-time measurement of industrial processes, real-time feedback control of these processes, temperature measurement of industrial processes for real-time molecular level monitoring, real-time measurement of environmental parameters, and detection of biomarkers in medical applications.

The details of one or more embodiments are set forth in the accompanying figures and the description below. Other features, objects and advantages of the described techniques will be apparent from the description and drawings and from the claims.

BRIEF DESCRIPTION OF THE DRAWINGS

Disclosed embodiments will be understood and appreciated more fully from the following detailed description taken in conjunction with the appended figures.

DETAILED DESCRIPTION

Figure 1A:
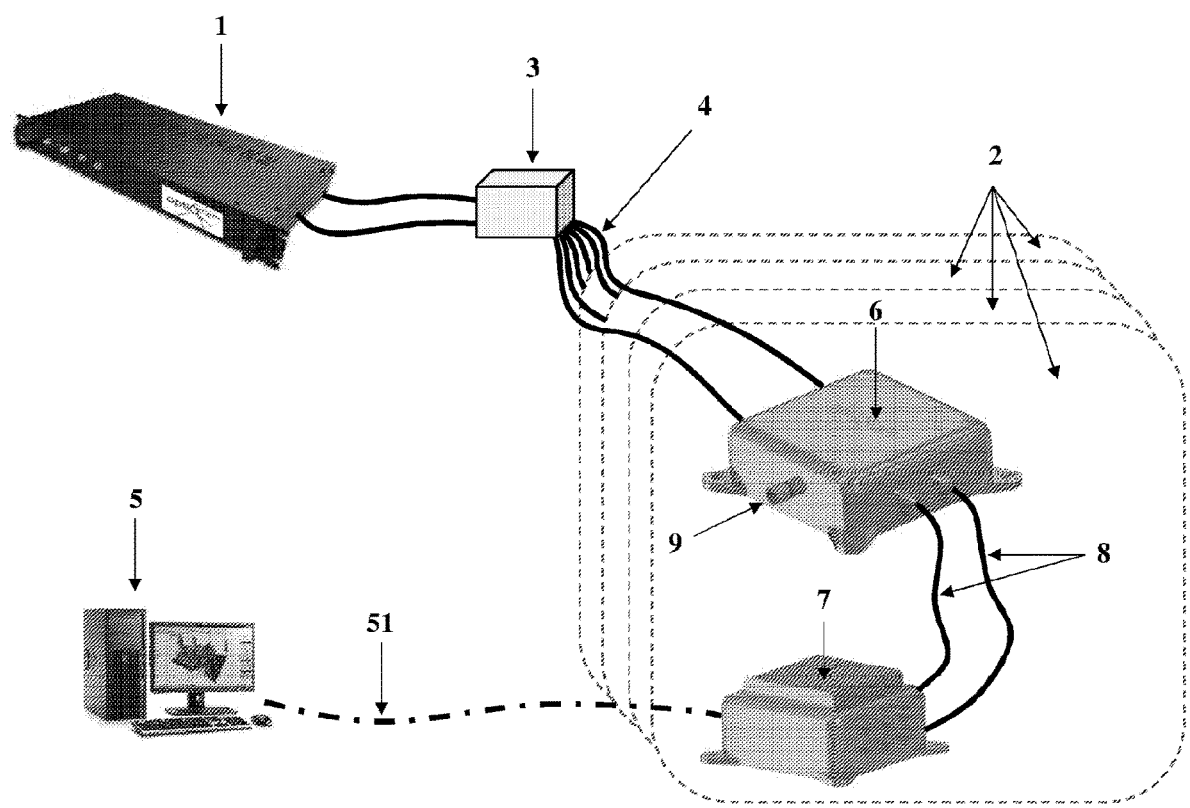
FIG. 1a schematically shows the SRS spectroscope of an embodiment comprising a laser generator connected via an optional optical switch to multiple on-site detection probes testing the samples in real time.

In the following description, various aspects of the present application will be described. For purposes of explanation, specific configurations and details are set forth in order to provide a thorough understanding of the present application. However, it will also be apparent to one skilled in the art that the present application may be practiced without the specific details presented herein. Furthermore, well-known features may be omitted or simplified in order not to obscure the present application.

The present application describes a general-purpose on-site spectroscope system or analyser capable of generating a high-resolution Raman spectrum in about 0.1 second per molecule. It is essentially based on the Stimulated Raman Scattering (SRS) Spectroscopy. The SRS is a known, powerful molecular detection technique that is several orders of magnitudes higher than spontaneous Raman, as mentioned in the background section. The SRS detection is essentially label-free, which means new molecules may be detected with a software by just tuning the tunable laser to the proper wavelength and selecting the corresponding calibration database. Thus, the use of the SRS spectroscope of an embodiment in molecular detection allows the target analyte molecules to actually define the way of processing signals and database comparison, and no hardware changes are needed in that case.

In a typical industrial process, there are usually several testing points located in a close proximity to each other. In most cases the testing points are located in extreme conditions, such as hazardous and explosive environments, which require special safety precautions. Laser sources require stable and controlled condition in order to generate high quality laser beams. Generating laser beams in extreme conditions is generally possible, but very expensive. Therefore, one of the possible solutions to this problem would be to place the laser generator far from the testing site, for example, in laboratory or office environments. Also, in many cases, the duration of the measurement is much shorter than the required interval between the measurements, so it is common to have several detection points on the same device.

The SRS spectroscope of an embodiment directly irradiates samples with laser beams, and analysis of the emitted laser radiation provides on-site real-time detection and concentration measurements of the target analyte molecules. It also supports sampling multiple target analytes simultaneously, very small in size, low in cost and provides on-line, real-time monitoring of gases, liquid mixtures and other materials on a molecular level in industrial processes sequentially. The probe is designed to be located very close to the measurement point connected to the material stream via a small pipe, making the sensing suitable for various industrial environment, such as high temperatures, explosive materials, corrosive conditions, high noise, and vibrations, and is capable of measuring streams in high pressures and high temperatures.

The terminology used herein is for describing particular embodiments only and is not intended to be limiting of the invention. The terms "comprising" and "comprises", used in the claims, should not be interpreted as being restricted to the means listed thereafter; they do not exclude other elements or steps. They need to be interpreted as specifying the presence of the stated features, integers, steps and/or components as referred to, but does not preclude the presence and/or addition of one or more other features, integers, steps or components, or groups thereof. Thus, the scope of the expression "a device comprising x and z" should not be limited to devices consisting only of components x and z. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached to", "connected to", "coupled with", "contacting", etc., another element, it can be directly on, attached to, connected to, coupled with or contacting the other element or intervening elements may also be present. In contrast, when an element is referred to as being, for example, "directly on", "directly attached to", "directly connected to", "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Reference is now made to FIG. 1a showing the SRS spectroscope of an embodiment comprising its major components and briefly defined as follows:

(1) Laser generator (1) is a subsystem in a form of a rack case placed in a user-friendly office working environment (that allows the use of the low-cost stable lasers) and containing a set of laser sources and an optical switch to switch between them on demand. It generates the sequence of laser beams needed for the SRS spectroscopy of the target analyte. A single laser generator may generate, for example, the laser sequence for 1-16 detection probes (2). The number of the probes (2) per the laser generator depends on the operational conditions and technological requirements;

(2) Detection probes (2) are rugged subsystems located close to the measurement point, connected to the laser generator through an optical switch (3) having two inputs and 2×N outputs, where N is the number of the probes. This optical switch is capable of directing the generated laser beam to the N probes via optical fibres (4). The detection probes (2) are further connected to the system server (5) via ethernet or industrial internet of things (IoT) communication (51), wired or wirelessly, and composed of two separate subunits: passive detection cell (6) and electronic receiver (7) placed in a close proximity to each other and interconnected with each other via two short optical fibres (8); wherein both the passive detection cell and the electronic receiver comply with the explosive safety regulations. These regulations are different for the detection cell and for the receiver and vary with a predefined distance of the device or unit from the material testing site. For instance, the safety requirements for the receiver located at some distance from the testing site of explosive materials (for example, in Zone 2 according to the ATEX/IECEx safety classification) are less strict than the safety requirements for the detection cell placed directly at the testing site, which is Zone 0 according to the ATEX/IECEx classification.

(3) System server (or computing unit) (5) runs the detection algorithms and database as well as system control, interfaces to the host system and user interface. A single server may actually control many different detection probes.

Figure 1B:
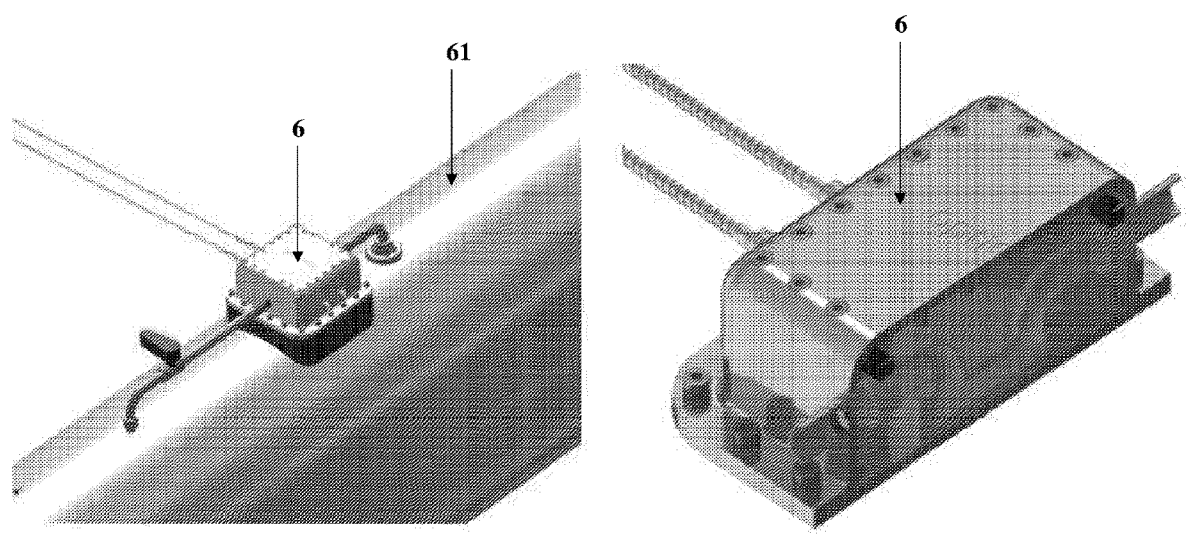
FIG. 1b schematically shows the detection cell located on the inlet gas pipe during the on-site real-time testing and its expanded view.

One inlet/outlet (9) for input/output of the tested material, such as gas or liquid, into the detection cell (6) is shown in FIG. 1a, while other one located at the opposite side is not visible. The detection cell (6) may be defined as an on-site passive unit, in which the laser beams interact with the target analyte molecules. The receiver (7) is a subsystem comprising optical and analogue frontends, receiving the laser beams and converting them into electrical signals. It will be described in detail below. FIG. 1b schematically shows the detection cell (6), which is located on the inlet gas pipe (61) during the on-site real-time analysis. The SRS spectroscope sends information on high-resolution inlet material compositions to the process control system every second.

Figure 2:
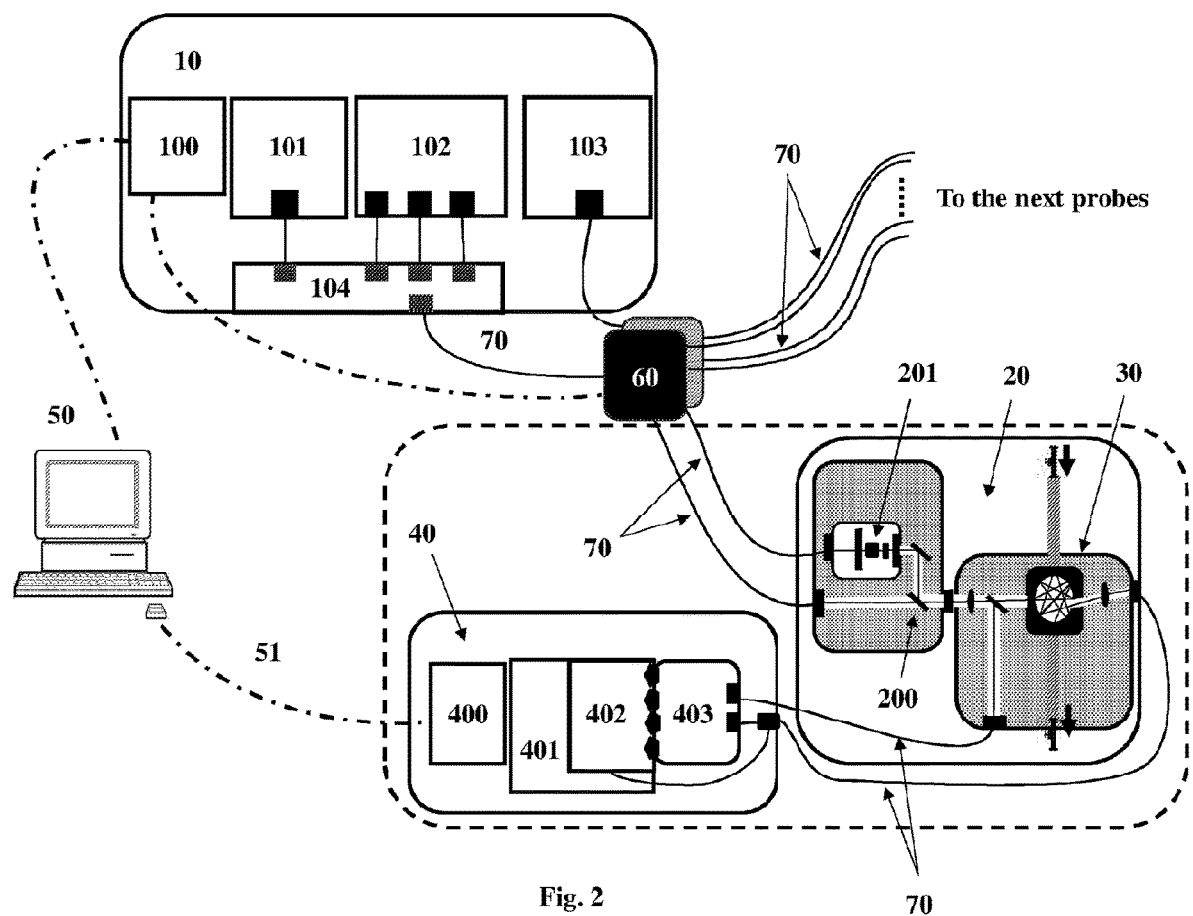
FIG. 2 schematically shows the system architecture overview of the SRS spectroscope of an embodiment.

Reference is now made to FIG. 2 schematically showing the system architecture of the SRS spectroscope. In one embodiment, the SRS spectroscope for high-resolution, multi-point, real-time, on-site molecular analysis of a sample, comprises:

(a) a laser generator subsystem (10) comprising a first laser (101 or 102) capable of generating a first laser beam (a pump signal) having a relatively low power of 50 mW to 1 W, and a second laser (103) capable of generating a second laser beam having a wavelength that matches the input of a passive Q-switch crystal (201), and transmitting said two laser beams into a passive detection probe subsystem (20) via optical fibres (70), wherein the spectral difference wavelength between said first laser beam and said passive Q-switch crystal (210) matches the excitation Raman wavelength of a target analyte in said sample;

(b) at least one passive detection probe subsystem (20) comprising:
  (1) said passive Q-switch crystal (201), capable of receiving said second laser beam and generating high-power short pulses of a Stokes signal from said second laser beam, and
  (2) a beam combiner unit (200) capable of combining said high-power short pulses of the Stokes signal with said first laser beam into a mixed laser beam, transmitting 5-10% of said mixed laser beam (a reference laser beam) to a receiver subsystem (40) via an optical fibre or through free space optics, transmitting the rest 90-95% of said mixed laser beam into a detection cell (30) containing said sample, and further transmitting the resulting laser beam after passing said detection cell (30) to said receiver subsystem (40) via optical fibres (70) or through free space optics;

(c) the receiver subsystem (40) capable of capturing said reference laser beam and said resulting laser beam onto an optical frontend (403) connected to an analogue frontend (402), converting said two laser beams to an analogue signal at said analogue frontend (402), converting said analogue signal to a digital signal, improving a signal-to-noise ratio, generating the SRS data for said sample, and outputting said SRS data to a computing unit (50) via ethernet wired or wireless (51); and (d) the computing unit (50) capable of collecting, analysing and displaying said SRS data in a readable format, controlling said SRS spectroscope, calculating molecular composition of the sample and concentration of the target analyte in said sample, obtained from said SRS data using a concentration algorithm, and transmitting the obtained calculation results to a process control system for improving and optimising the process via real-time close loops or via massive data collection and big data analysis;
wherein
(i) said laser generator subsystem (10) is distant from said passive detection probe system (20), said distance is determined by safety and design requirements in analysis of said sample;
(ii) said passive detection probe subsystem (20) is purely optical and contains no electronic components;
(iii) said high-power short pulses of the Stokes signal are generated using said passive Q-switch crystal (201) in a close proximity to said detection cell (30), and filtered out at the exit from said detection cell (30);
(iv) said receiver subsystem (40) is asynchronous with respect to said laser generator subsystem, detecting the SRS signal at the exact pre-defined timing independent of capturing said laser beams, thereby improving the overall signal-to-noise ratio and obviating the need for signal transduction from said laser generator subsystem (10);
(v) said high-power Stokes signal is used as an acquisition clock for detection (clocking) of said SRS signal and removal of a fundamental jitter, thereby obviating the need for tracking said jitter in said SRS spectroscope; and
(vi) said SRS data is collected as a lost signal in said low-power pump signal, which is symmetric to said high-power Stokes signal, thereby obviating the need for synchronisation of said signals.

Thus, the SRS signal built on the low-power pump is "blindly" detected based on the pre-defined timing from the high-power Stokes signal (clock). "Blind" detection means that the SRS signal built on the low-power pump cannot be directly detected because of its very low signal-to-noise ratio. It is in the range of 10-500 mW when captured by the receiver subsystem. Therefore, being deeply buried in the noise, it is almost invisible or undetectable. In contrast, the high-power Stokes signal having very high intensity in the range of 1-50 kW is easily detectable by the receiver, but has a relatively short lifetime of about 500 picoseconds (ps), which makes it challenging to use it as a clock for the upcoming lower-power pump signal. Therefore, in some embodiments, the Stokes signal is electronically processed to increase its lifetime to about 5 microseconds (μs). Such wide digital signal does not require expensive electronics for clocking the pump signal.

Once the high-power Stokes signal is detected, it is used as a stopwatch for clocking the known (pre-defined) time for measuring the pump signal. In other words, the invisible pump signal is "blindly" measured in the exact pre-defined interval of time after detection of the Stokes signal. Thus, the use of the Stokes signal as a clock for the pump signal makes it possible to operate the receiver subsystem totally asynchronously to the laser generator subsystem. Therefore, there is no need for signal transduction from the laser generator subsystem (no need for physical connection between the laser generator and receiver), which makes it possible to use the receiver in a relatively close proximity to the detection cell for safety reasons and improving the overall signal-to-noise ratio of the SRS signal.

The sample containing the target analyte molecules being identified and/or quantified may be of any physical phase (plasma, gas, liquid or solid). The sample may contain any molecules being identified and/or quantified or a mixture of these molecules. In addition, the sample may contain non-target molecules, which may be not tested. An example of such mixture may be a solution of an organic compound being tested dissolved in a solvent which is not tested. When more than one sample is used, the series of samples may contain different target analyte molecules having different concentrations, for example, different chromatographic eluates or fractions leaving chromatographic systems over time or differing gases evolved in industrial processes over time. The "sample" may also be herein referred to as a "test sample" or "target analyte sample" without any intent at distinguishing between these terms. The materials being tested or analysed may also be herein referred to as "analytes" or "target analytes".

Figure 3:
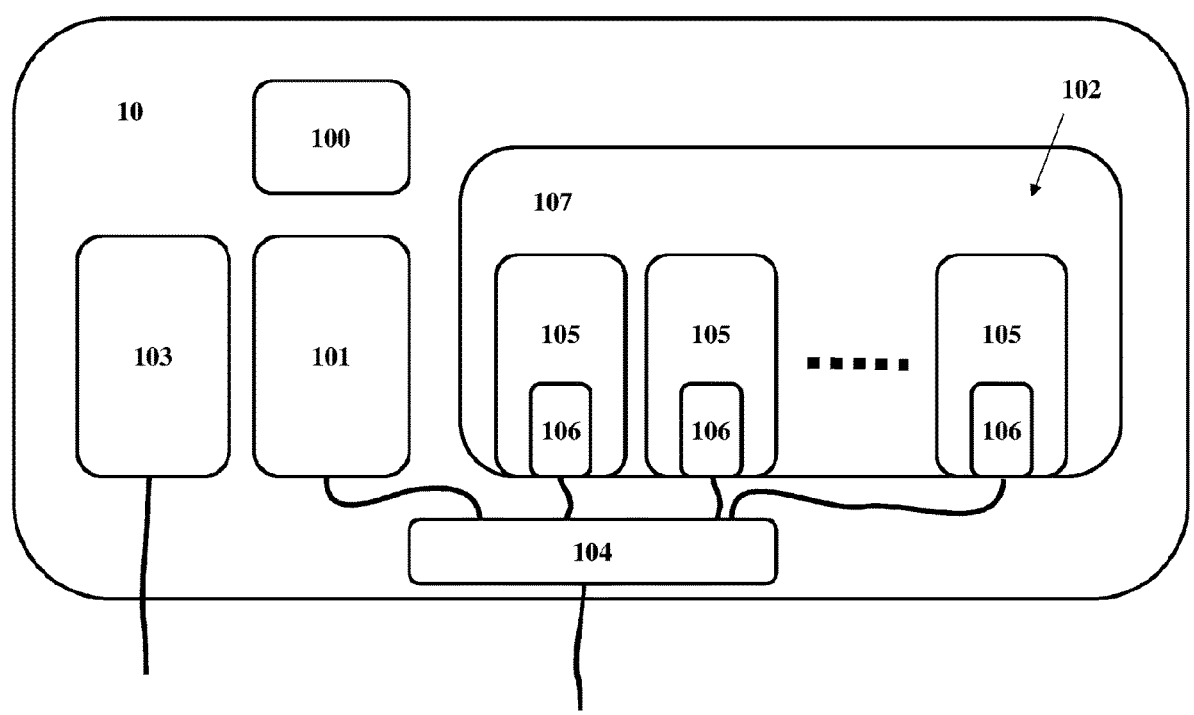
FIG. 3 shows the block diagram of the laser generator subsystem of the SRS spectroscope of an embodiment.

Reference is now made to FIG. 3 showing the block diagram of the laser generator subsystem (10) of the SRS spectroscope of an embodiment. In a particular embodiment, said first laser is one or more tunable laser diodes (101) or a combination of one or more tunable laser diodes (101) and one or more fixed-wavelength laser diodes (102).

In another embodiment, said first laser is an array of fixed-wavelength laser diodes (102) capable of generating laser beams having different wavelengths and being activated in a predefine sequence for selecting a particular fixed-wavelength laser diode (102) from said array for generating said first laser beam, wherein at a certain time, only one of said fixed-wavelength laser diodes (102) is selected to transmit said first laser beam into said passive detection probe subsystem (20). The particular fixed-wavelength laser diode is selected from the array or alternatively, the tunable laser diode is tuned, so that the spectral difference wavelength between said first laser beam and the passive Q-switch crystal (210) matches the excitation Raman wavelength of a target analyte in the sample.

FIG. 3 schematically shows an exemplary embodiment of the array (102) of 14-pin fixed-wavelength laser diodes (106) built on an electronic motherboard (107), wherein each of said laser diodes (106) of the array is mounted on its corresponding laser daughter card (105). All the cards (105) are connected to the optical switch (104) used for switching between the laser diodes (106) in the array. The second laser (103) is actually a high-power laser diode capable of generating a second laser beam with a wavelength that matches the input of a passive Q-switch crystal (201). In a particular embodiment, said second laser is 808-nanometres laser diode having power in the range of 2-20 Watt and capable of generating the second laser beam passing through the passive Q-switch crystal and thereby resulting in 1064-nm high-power short pulses of the Stokes signal.

In a particular embodiment, the laser generator subsystem (10) may further comprise a central processing unit (100) capable of tuning said tunable laser diode (101) to a predefine set of wavelengths, and/or an optical switch (104) capable of fast switching between said fixed laser diodes (106) in said array in a predefine sequence. The central processing unit (100) may also be capable of controlling said optical switch (104) and selecting a particular fixed-wavelength laser diode (106) from said array for generating said first laser beam having a specific wavelength, so that the spectral difference wavelength between said first laser beam and the passive Q-switch crystal (210) matches the excitation Raman wavelength of a target analyte in said sample.

The SRS spectroscope of the preceding embodiment may further comprise an optical switch (60), which is shown in FIG. 2, capable of directing said generated first laser beam into the passive detection probe subsystem (20). In some embodiments, said optical switch is a 2×2N micro-electromechanical system (MEMS) mux, where N is the number of the probes. In yet further embodiment, the optical fibre (70) transmitting said first laser beam into said passive detection probe subsystem (20) may be a single-mode optical fibre or a polarisation-maintaining optical fibre. In a specific embodiment, the optical fibre (70) transmitting said second laser beam into said passive detection probe subsystem (20) is a multi-mode optical fibre, while the optical fibres (70) connecting said passive detection probe subsystem (20) to said receiver subsystem (40) are multi-mode optical fibres.

The SRS spectroscope of an embodiment may comprise more than one passive detection probe subsystem (20) for testing more than one sample, and may comprise more than one optical switches (60) capable of switching between said passive detection probe subsystems (20) and selecting a particular passive detection probe subsystem for further conducting the test on a specific target analyte. In another particular embodiment, a first one of said optical switches is a single-mode and polarisation-maintaining MEMS mux and a second one of said optical switches is a multimode MEMS mux.

In a particular embodiment, one of said passive detection probe subsystems is used for calibration. The "calibration probe" is a term used herein to define a sample where the material or materials to be identified are known materials of known concentration used for calibrating the system's hardware and/or acquired data. The calibration sample is used when a calibration method such as the one described below is employed. Use of the calibration methods on the target sample data collected with the systems may not always be employed or even needed. These materials may also be referred to as "calibration materials" with no intention at distinguishing between these terms. The calibration probe may be considered to be a form of the target sample as the testing method for this sample is the same as for the target sample using the same or similar system configuration. Similarly, conversion of a laser beam passing through the calibration probe to electronic signals and their processing is the same as that of the laser beam passing through a target sample.

Figure 4:
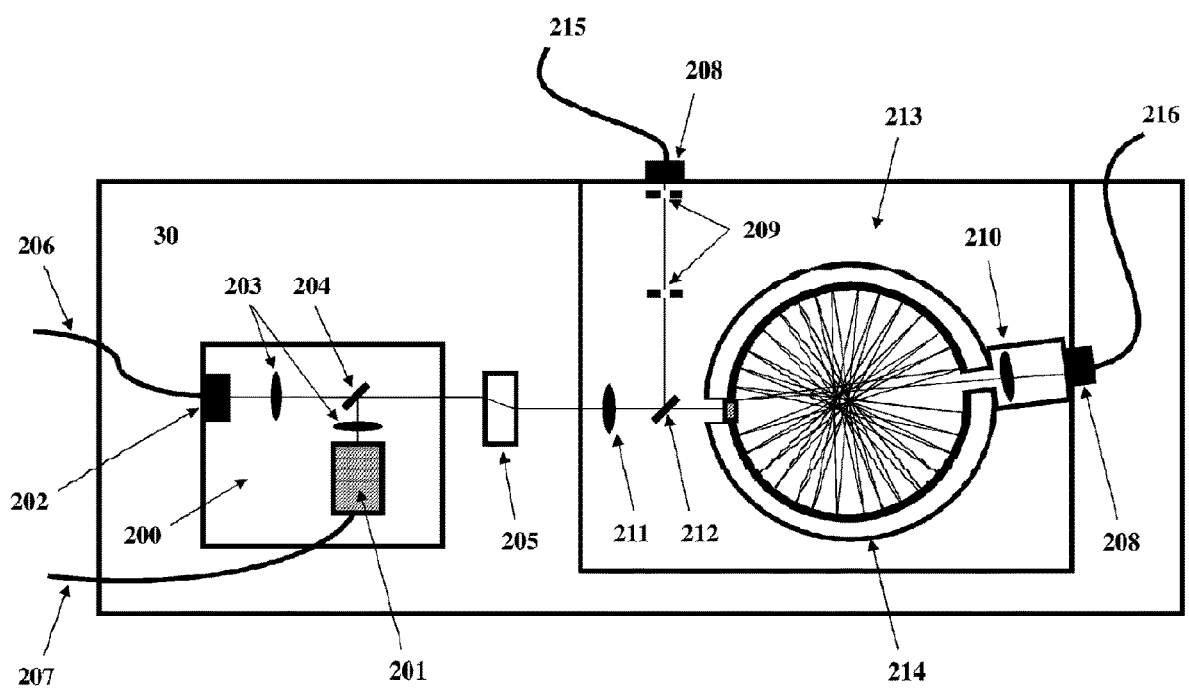
FIG. 4 schematically shows the detection cell of the SRS spectroscope of an embodiment.

Reference is now made to FIG. 4 showing an exemplary embodiment of the detection cell (30) for the passive detection probe subsystem of the SRS spectroscope. In this exemplary embodiment, the detection cell (30) contains two major units:
1) the Q-switch crystal (201) together with the beam combiner unit (200), and
2) the sample detection unit (213) comprising the multi-pass cell (214).

The multi-pass cell configuration of the SRS spectroscope shown in FIG. 4 is an exemplary embodiment, and the SRS spectroscope of an embodiment is not limited to this configuration. The multi-pass cell (214) may be equally replaced, for example, with a single-pass cell in the same configuration of the SRS spectroscope.

In more details, said detection cell (30) may comprise:
(1) a passive Q-switch crystal (201) capable of generating high-power short pulses of the Stokes signal from the second laser beam;
(2) a beam combiner unit (200) comprising collimation lenses (203) and 45° dichroic mirror (hereinbelow, "dichroic combiner") (204) between these lenses, capable of combining said high-power short pulses of said Stokes signal with the first laser beam into a mixed laser beam, and transmitting said mixed laser beam into a sample detection unit (213) via a beam displacement lens (205); and
(3) the sample detection unit (213) comprising beam splitter (212) capable of splitting said mixed laser beam into:
  (i) a "reference beam" transmitted directly to the optical frontend of the receiver system via a multi-mode optical fibre (215), and
  (ii) a "main beam" entering the multi-pass cell (214), interacting with the sample inside this multi-pass cell and then transmitted via multi-mode optical fibre (216) as a "resulting beam" to the optical frontend of the receiver system.

The multi-pass cell (214) is capable of receiving the main beam from the beam splitter (212) and the sample of the target analyte from an external source, for example a gas pipe. In fact, the multi-pass cell (214) is sequentially irradiated by said main beam. In an exemplary embodiment, the splitter (212) provides the 95:5 splitting ratio, wherein about 5-10% of the mixed laser beam is the reference laser beam and about 90-95% of the mixed laser beam is the main laser beam. The sample detection unit (213) further comprises focus lens (211) and two optical cavities (209) of 100µϕ and 500µϕ, respectively. A 1064-nm Notch filter (210) is installed at the exit of the laser beam from the multi-pass cell.

In another embodiment, the multi-pass cell (214) may be replaced with a single-pass cell, as mentioned above. However, the multi-pass cell provides much better detection sensitivity than the single-pass cell by increasing the total optical path length that travels through the sample volume.

The exemplary optical fibres connecting the beam combiner unit (200) with the laser generator subsystem are 8-µϕ polarisation-maintaining optical fibre (206) and 62-µϕ or 200-µϕ multi-mode optical fibre (207). The multi-mode optical fibre (215) transmits the reference beam to the optical frontend of the receiver subsystem. The same type multi-mode optical fibre (216) transmits the resulting beam to the optical frontend of the receiver subsystem. Each optical fibre has its own optical fibre interface (202 or 208) allowing the laser beams to enter and exit the optical fibres. In another specific embodiment, the distance between said laser generator subsystem and said passive detection probe system is in the range of 10-500 m, while the distance between said detection cell and said receiver subsystem is in the range of 10 cm to 50 m.

The passive Q-switch (201) is the major element of the SRS spectroscope of an embodiment. As mentioned above, it generates the 1064-nm high-power short pulses of the Stokes signal from the 808-nanometres laser diode (second laser beam). The Stokes pulses having a power in the range of 1-50 kW are generated using this passive Q-switch crystal in a close proximity to the detection cell, and filtered out at the exit from said detection cell.

In general, in a passively Q-switched laser, instead of an electrically controlled modulator, a saturable absorber is used. In its unsaturated state, it introduces a high optical loss. The laser gain overcomes that loss before lasing can start. When the laser radiation becomes stronger, it eventually saturates the losses, or in other words, it reduces them to a much lower value. From this point on, the laser power rises rapidly until the gain is also saturated. The power efficiency of a passively Q-switched laser may seem inevitably poor because of the introduced absorption. But that is not true. If the saturation energy of the absorber is far below that of the laser gain medium, only a small fraction of the supplied energy is needed to make the absorber transparent. However, real absorbers often exhibit some amount of non-saturable absorption, which does have an impact on efficiency. For example, the actual overall power efficiency of about 10% in average for the 300 mV 1064-nm laser signal (25 kW per 800 ps pulse) is generated out of 3 W 808-nm laser. Common saturable absorber materials are certain ion-doped crystals. For 1-µm lasers, such as Nd:YAG, the $Cr^{4+}$:YAG crystals are used in most cases.

For a passively Q-switched laser, the pumping phase lasts until the pulse build-up begins, or in other words until the net round-trip gain becomes slightly positive. That happens once a certain amount of energy has been stored in the gain medium. The amount of stored energy at the time of pulse build-up does not depend on the pump power. For a higher pump power, this point is just reached earlier. Only the diameter and shape of the pump beam have some influence: The larger the pump diameter, the greater the energy that must be deposited until the pulse formation can start. Thus, the fluctuations of pump power will essentially translate into timing fluctuations but not into fluctuations of the pulse energy. This is completely different for actively Q-switched lasers, where both the pulse timing and energy are affected.

Thus, the use of the passive Q-switch located close to the detection cell allows using the laser generator in office environments and transmitting the generated laser beams via optical fibres and optical switches to several detection probes located at the testing points far from the laser generator. This makes possible to conduct the tests in aggressive, explosive and hazardous environment. Moreover, it is well known that laser pulses created by high-power lasers are required for performing the SRS spectroscopy. However, it is impossible to transfer the high power laser pulses via optical fibres due to potential damage to the fibres. Attaching the passive Q-switch crystal to the detection cell makes it possible to transmit the laser beams via optical fibres in a low-power continuous-wave mode and generate the high-power pulses only at the detection cell. In that case, the high-power short pulses of the Stokes signal are created in a small space between the Q-switch crystal and the detection cell.

As discussed above, the SRS spectroscope of an embodiment may have a special compliance with explosive safety regulations, for example, IECEx (international) or ATEX in Europe. In many cases, in industrial processes, sensing devices or analysers placed near the detection point must comply with the explosive safety regulations, which apply severe restrictions on the electronic systems and other strict requirements on the power of the lasers. As the SRS spectroscope of an embodiment is based on the passive detection cell, there is absolutely no electronics in the detection cell, but only low-power optical fibres, and the electronic receiver may be placed at a safe distance.

Figure 5:
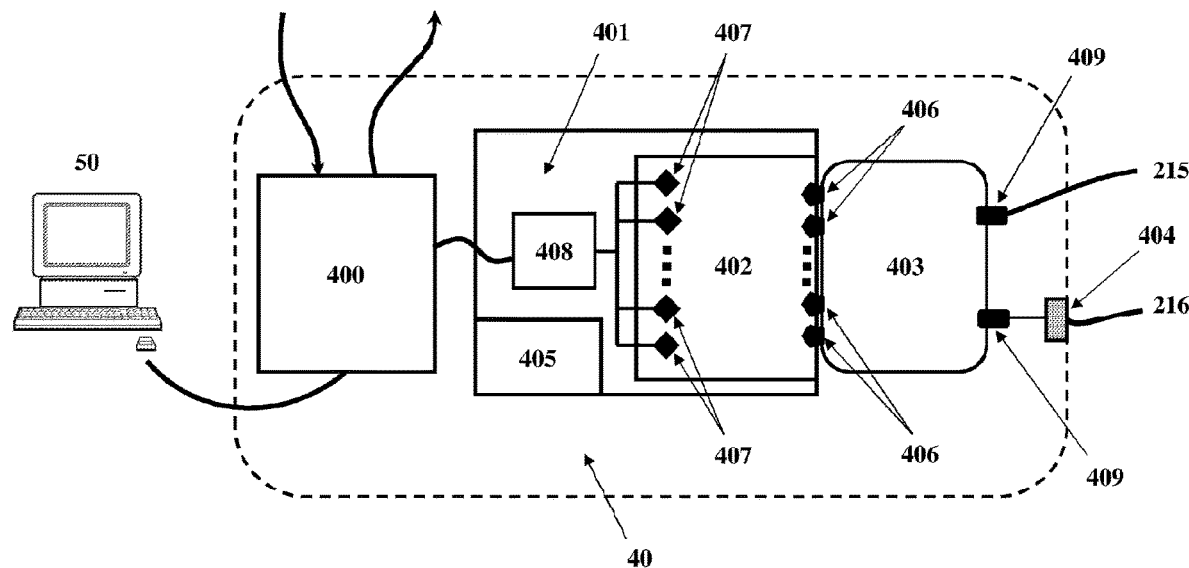
FIG. 5 shows the block diagram of the receiver subsytem of the SRS spectroscope of an embodiment.

Reference is now made to FIG. 5 schematically showing the receiver subsystem (40) of an embodiment comprising:
(1) the optical frontend (403) connected via multi-mode optical fibres (215 and 216) to the detection cell of the passive detection probe subsystem, and containing a plurality of photodetectors (406) adapted and configured for receiving the reference and resulting laser beams and directing the reference and resulting laser beams to an analogue frontend (402);
(2) the analogue frontend (402) capable of converting said reference and resulting laser beams into the corresponding analogue signals and transmitting said analogue signals to a digital board (401),
(3) the digital board (401) containing a plurality of analogue-to-digital convertors (ADCs) (407) for converting said analogue signals to digital signals, one or more analogue filters for analogue processing, a programmable gain control (PGC) circuit, one or more digital signal converters, for example, pulse to transistor-transistor logic (TTL) converters, for converting the Stokes pulses to the digital signals (the TTL pulses in the present example) and using the latter as triggers for the ADCs (407), and either programmable array logic (PAL) or field programmable gate array (FPGA) device (408) for interaction with the computing unit (400);
(4) the computing unit (400) comprising a digital signal processor (DSP) and/or central processing unit (CPU) capable of receiving the digital signals from said ADCs, processing and calibrating them, and generating a SRS spectrum from said processed digital signals.

The receiver subsystem (40) may further contain a power source (405), such as a commercially available battery, a fibre optical attenuator (404) capable of reducing the power level of an optical signal in an optical fibre, and fibre interfaces (409). Thus, the main functionality of the receiver subsystem (40) is to acquire the optical signals, perform initial analogue processing, convert the analogue signals to digital signals and send them to the CPU for further digital signal processing.

One of the known disadvantages of a passive Q-switch system is that the output pulse timing is unstable and has repetition rate jitter of ~2%, which means that the SRS signal at the pump laser has the same jitter. Using the standard fast clock in the receiver module, extracting such signal and overcoming the jitter may be rather challenging. Moreover, in the SRS method, the pump power loss (the desired SRS signal) occurs exactly at the same time when the Stokes pulse occurs. The acquisition concept is therefore to use the Stokes signal, which is a very strong and clean pulse signal, to acquire the pump signal. The main objective in that case would be to convert the Stokes pulse to digital signal (i.e. TTL pulse) and use it as a trigger for the analogue to digital convertors. However, since the Stokes signal is being generated by the passive Q-switch, it has a fundamental jitter. Therefore, the obtained Stokes signal may be used as an acquisition clock for removing a fundamental jitter, thereby obviating the need to track said jitter in the SRS spectroscope of an embodiment. Thus, the Stoke pulses may be used in the SRS system of an embodiment to actually capture the SRS on the pump signal.

Figure 6:
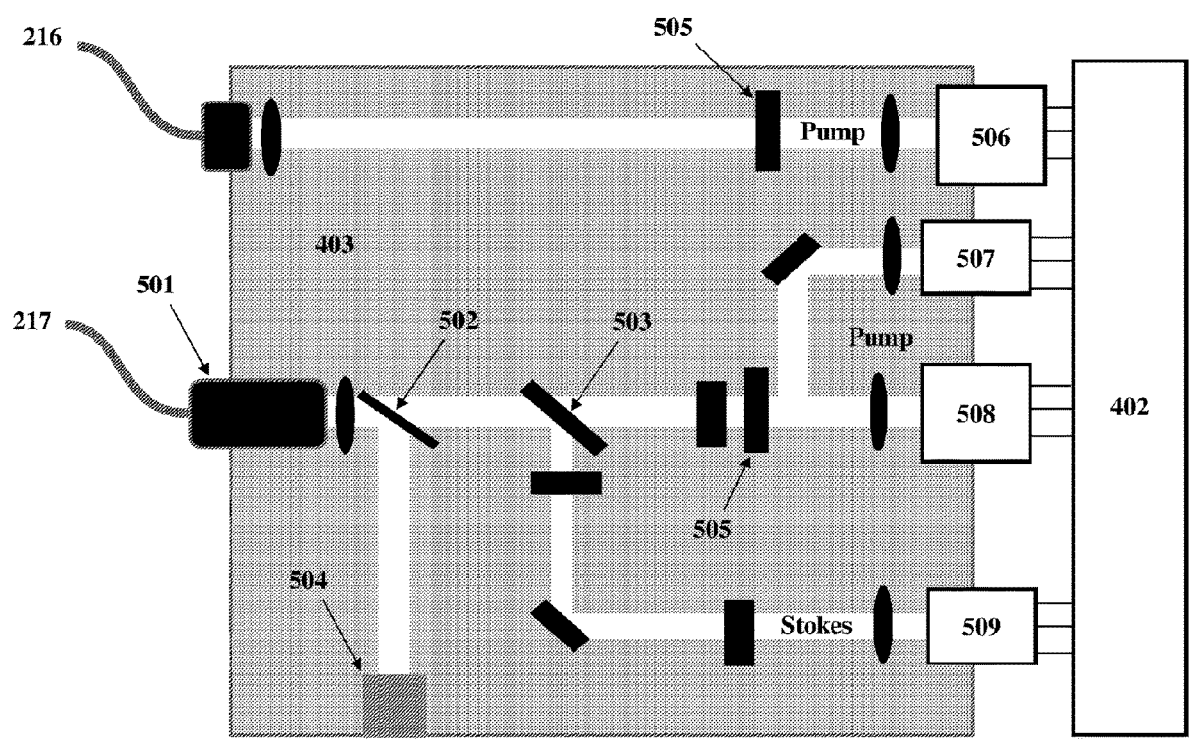
FIG. 6 schematically shows the exemplary optical frontend of the SRS spectroscope of an embodiment.

Reference is now made to FIG. 6 schematically showing the exemplary optical frontend of the SRS spectroscope of an embodiment. The reference laser beam is entering the optical frontend from the optical fibre (215), passing the 1064-nm Notch filter and converted to the corresponding "pump reference" analogue signal at the photodiode (506). The resulting laser beam from the detection cell is entering the optical frontend from the optical fibre (216) via fibre control optical attenuator (501) and is split with the 90:10 splitter (502) to about 90% main beam and about 10% beam transmitted to testing port (504). The main beam is further split with dichroic mirror or splitter (503) into the "pump beam" and the "Stokes beam". The Stokes beam having 1064-nm wavelength after passing a lens is hitting photo-diode (509) and converted to the analogue signal therein. The pump beam after passing the 1064-nm Notch filter (505) is converted to the "pump DC" and "pump AC" electrical signals at photodiodes (507) and (508), respectively.

The receiver subsystem is using the Stokes pulse to capture the SRS signal on the pump signal. The Stoke pulse has a very high signal-to-noise ratio, which is a small fraction of 25 kW pulse, and it is captured by the photodiode (509). The pump SRS signal is a small AC signal having the relatively low signal-to-noise ratio. This signal is amplified using the high gain transimpedance amplifier. The amplification process creates delay of several nanoseconds to the pump AC signal. The conversion of the Stokes pulse to the transistor-transistor logic (TTL) signal makes it possible to use this signal as a clock to the analogue-to-digital convertor (ADC). Since both signals have the same jitter, the adjustment of the delay of the signals allows capturing the pump AC signal in the right timing and makes it possible to overcome the fundamental jitter problem. In a specific embodiment, there are three analogue-to-digital convertors (ADCs) installed on the digital board, with 100-picosecond delay between them to capture three-samples point around the peak of the SRS signal.

Usually, it is required to measure the target analyte molecules in a wide range of concentrations. As a result, there may be a wide range of amplitudes of the SRS signal, which is difficult to register in the same probe in the same measurement. As described in the background section, for every target molecule, when the condition $\Omega=\Delta\omega$ is met, $\Delta I_p$ (SRL) and $\Delta I_s$ (SRG), which are changes of the illuminating beam intensities previously described resulting from the SRS phenomena, is proportional to concentration. The emitted optical signals $\Delta I_p$ and $\Delta I_s$ are converted to analogue electronic signals, when both the pump and Stokes lasers are activated. Since the SRS is used under conditions where the signal-to-noise ratio is low, it is difficult to extract $\Delta I_p$ and $\Delta I_s$ from the corresponding analogue electronic signals. A straightforward solution would be using very accurate wide-range ADCs, typically 14-18 bit, which allow converting the analogue electronic signals derived from $I_p$ and $I_s$ to digital signals without losing the relevant data $\Delta I_p$ and $\Delta I_s$. With nanosecond laser pulses, these ADCs are very fast (in the range of gigahertz). Such ADCs typically are custom-made and very expensive, fit only for academic and research institutes but unsuitable for commercial systems used in industry.

Another challenge is that the DC input power to the photodetector is limited to only few milliwatts, and this signal can vary from probe to probe or from one molecule to another molecule. To solve this problem, the present applicant suggests implementing the programmable gain control (PGC), which has previously been used in various communication and radar applications, but has never been used in spectroscopy.

The PGC is created by installing the controlled optical attenuator (501) shown in FIG. 6 at the optical input of the AC photodiode (508). The pump DC power is being measured by the dedicate photodiode (507). Using data collected from this photodiode makes it possible to optimize the input power to the AC photodiode (508) by adjusting the optical attenuator. In addition, there is a controlled analogue amplifier installed at the input to the ADC. The signal-to-noise ratio of the pump AC signal may be improved by applying many repetitions, for example 256 to 4256 times, of the same measurement and using various signal processing methods to improve the signal-to-noise ratio. For example, the measurement of the maximum digital amplitude of the first few repetitions makes it possible to use low-range ADCs (8-10 bits) and adjust the input voltage to the ADC, so that the full range of the ADC will be used to gain high resolution samples. Thus, the digital signals may be used to adjust the actual value by multiplying each sample by the two AGC values.

Thus, application of the analogue signal processing to the analogue electronic pump and Stokes signals, prior to their digital conversion as described above, enables extraction of the relevant data $\Delta I_p$ using simpler and cheaper ADCs, such 8-10 bit, while obtaining high signal-to-noise ratio and high resolution. This processing can be achieved by employing a variety of analogue processing solutions. In yet further embodiment, mathematical extraction of the SRS signal from the low-power pump signal recorded with the SRS spectroscope of an embodiment may be conducted using standard components and algorithms.

The hardware calibration of the SRS spectroscope of embodiments is performed prior to the measurement process. The laser diodes of the laser generator subsystem are calibrated based on the results obtained from the calibration sample being used. This may be done, for example, by using a thermo-electric cooler attached to each laser diode and tuning control parameters to obtain a desired temperature. Moreover, the software adaptive calibration is performed by measuring the target samples, substantially simultaneously with the calibration sample measurement. The changes in the spectrum peak amplitudes and peak wavelengths are recorded. A weighted moving average algorithm or some other known adaptive calibration algorithms may be applied to the calibration data and used to calibrate the measured target sample results.

There may be additional elements that are included or in communication with the SRS spectroscope of an embodiment. These include, but are not limited to a power source, a temperature control unit and/or pressure control unit (both installed near the detection cell). Communication between these units and the elements and subsystems discussed above can easily be combined by persons skilled in the art and therefore no additional details are presented. Output and/or control devices, such as displays, printers, alarms or controllers may be in electronic communication with the system server (50). In other embodiments, the results of the collected SRS spectral data can be forwarded to a controller of an operational system, the latter integrated with the SRS spectroscope of an embodiment. This integration allows for information to be forwarded directly from the system server (50) to the controller of the operational system. The information could provide real-time results inter alia indicating that the target operational system is operating under less than optimal conditions. The analysis of the received information can be used to change/modify/retune the setup of operational system to which it is connected. The result of such modification could be, without intending to limit the present invention, feedback input to ensure operation within the required limits, safety shut-down, limit alerts, or alerts as to the presence of undesirable or unexpected materials and/or materials in undesirable quantities in the target samples being analysed. The controller of the integrated operational system may then shut down the operational system or otherwise indicate to a user that manual shut down or another corrective operation is required.

The SRS spectroscope of an embodiment comprising a passive Q-switch crystal may be used for high-resolution, real-time and on-site molecular analysis of a sample in industrial settings in explosive, hazardous and aggressive environment. The analytical data may be collected through continuous or periodic SRS spectrum generation. The industrial settings may include, but without intending to limit the present application, analysis of gas or liquid, analysis of the chemical composition of very small samples in sample streams in extreme temperature, noise, vibration, corrosive environment. These can be integrated directly with other operational systems, for example, and without intending to limit the present invention, systems used in industrial chemical processes, in air and water analysis, in toxicology detection, in laboratory and field analytical chemistry, and in medical detection. Such integration would, for example, in the case of industrial chemical processes provide on-line, real-time composition analysis of the target analyte/s and allow real-time correction/s of process conditions.

Figure 7:
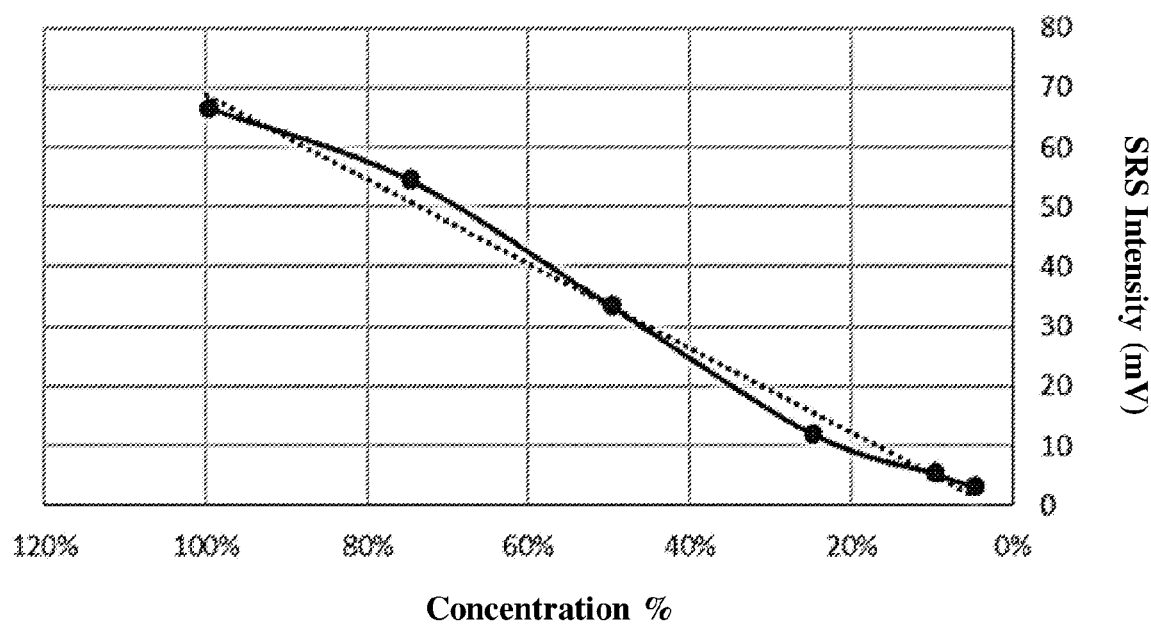
FIG. 7 shows an example of the SRS intensity data recorded for different concentrations of toluene in benzene solution with the SRS spectroscope of an embodiment.
Figure 8:
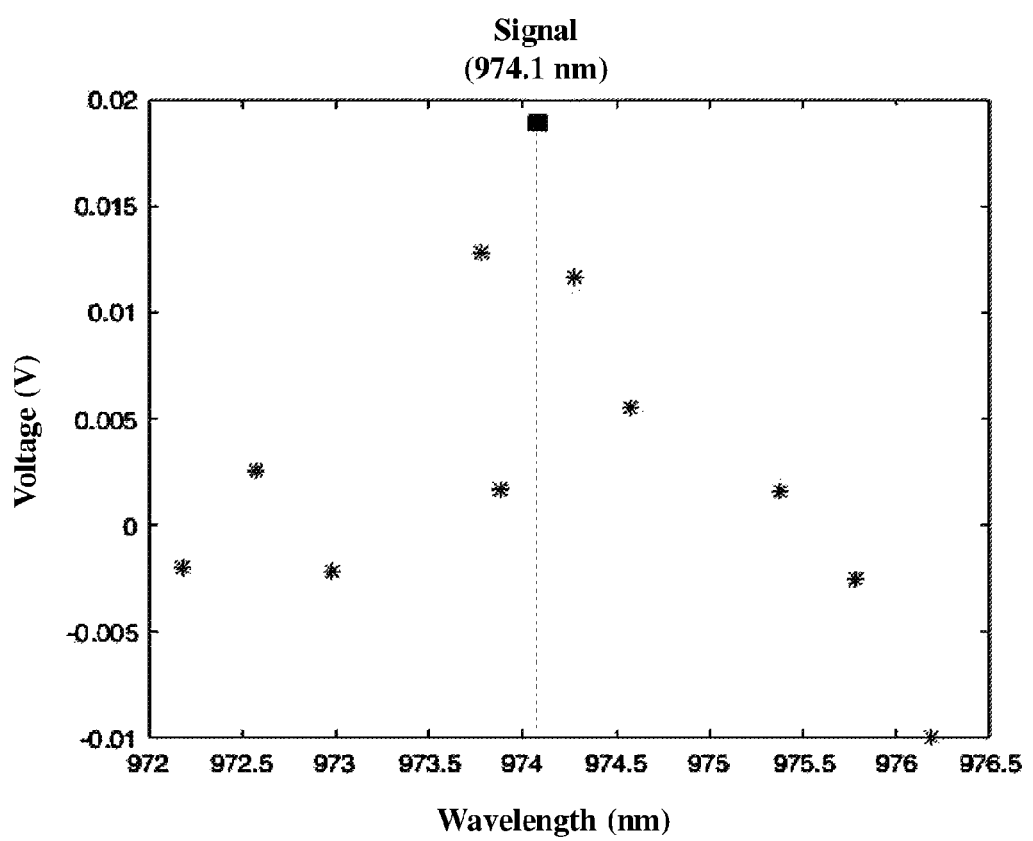
FIG. 8 shows an example of scanning 4 nanometres (nm) around the expected peak of propane gas.
Figures 9A, 9B:
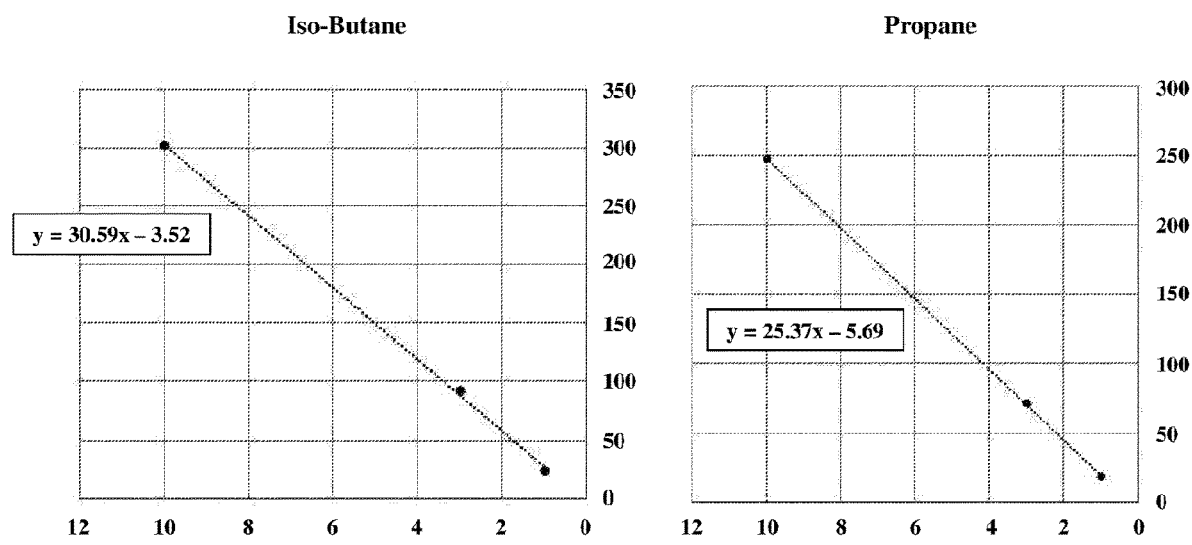
FIGS. 9a and 9b demonstrate the measurements of natural gas components for 1%, 3% and 10% of iso-butane and propane, respectively. The SRS intensity is measured in voltage versus concentration.

The following experimental data exemplify the use of the SRS spectroscope of an embodiment. FIG. 7 shows an example of the SRS intensity data, which was recorded with the SRS spectroscope, for different concentrations of toluene in benzene solution. An example of scanning 4 nanometres (nm) around the expected peak of propane gas is shown in FIG. 8, while FIGS. 9*a* and 9*b* demonstrates the measurements of natural gas components for 1%, 3% and 10% of iso-butane and propane, respectively. The SRS intensity is measured in voltage versus concentration.

As noted above, it is very important to calibrate the SRS spectroscope before or during its operation. One of the calibration methods is known as an adaptive calibration, in which parameters are changed during the measurement process in order to minimize errors. An exemplary, but non-limiting, method that may be used is the well-known least mean squares filter method. In the present application, measurement errors may be estimated by measuring the difference between the expected results of the calibration sample(s) to the actual measured results of the calibration sample(s). The differences are measured in the two dimensional space of: 1) wavelength (or equivalently—frequency) and 2) intensity.

Calibration parameters are defined as the calculated correction values that should modify the target sample measurements to compensate for variations in laser source performance. The method for calculation of calibration parameters is adaptive since both current and previous measurements are used to modify the latest measurement results in an accumulated manner. The actual present results are added to prior results when using an adaptive algorithm. Such an algorithm, which is an exemplary non-limiting example, may be a moving average algorithm. The outputs of the calibration algorithm are calibration parameters in two dimensions, wavelength and intensity, as mentioned above.

In the present application, separate calibration parameters are calculated for each fixed-wavelength laser diode in the fixed-wavelength laser diodes array and for the tunable laser. The calibration sample composition provides at least one Raman peak associated with at least one of the laser diode wavelengths in each of the laser diodes in the array and a pre-determined wavelength of the tunable laser.

The calibration parameters are utilised in the invention in two manners:

1. Physical calibration—This is accomplished by modification of the physical settings of the lasers. Changes in physical settings are calculated based on the above mentioned calibration parameters and known physical characteristics of the laser, as determined by use of a formula or look-up table. This includes, for example, changing the laser diode's temperature in order to change its wavelength and changing the laser amplifier input current in order to change the laser output power. It is possible to distinguish between errors caused by the first laser from errors caused by the second laser since the errors caused by the first laser producing a pump signal are common to all laser, while the errors caused by the second laser would be specific to each laser responsible for producing the Stokes signal.
2. Database calibration—Each of the measured results of the target samples is modified according to the calibration parameters in both dimensions, wavelength and intensity. A different set of calibration parameters is used for each laser diode irradiating the passive Q-switch crystal. The modified measured results are then used to generate the SRS spectrum of the target samples which is used for identification and/or quantitative analysis of the target analytes. Note that the calibration material need not be the same material as the target analyte. As long as a known spectrum or series of spectra at different known quantities/concentrations for one or more known materials is available, adaptive calibration can be used.

Figure 10:
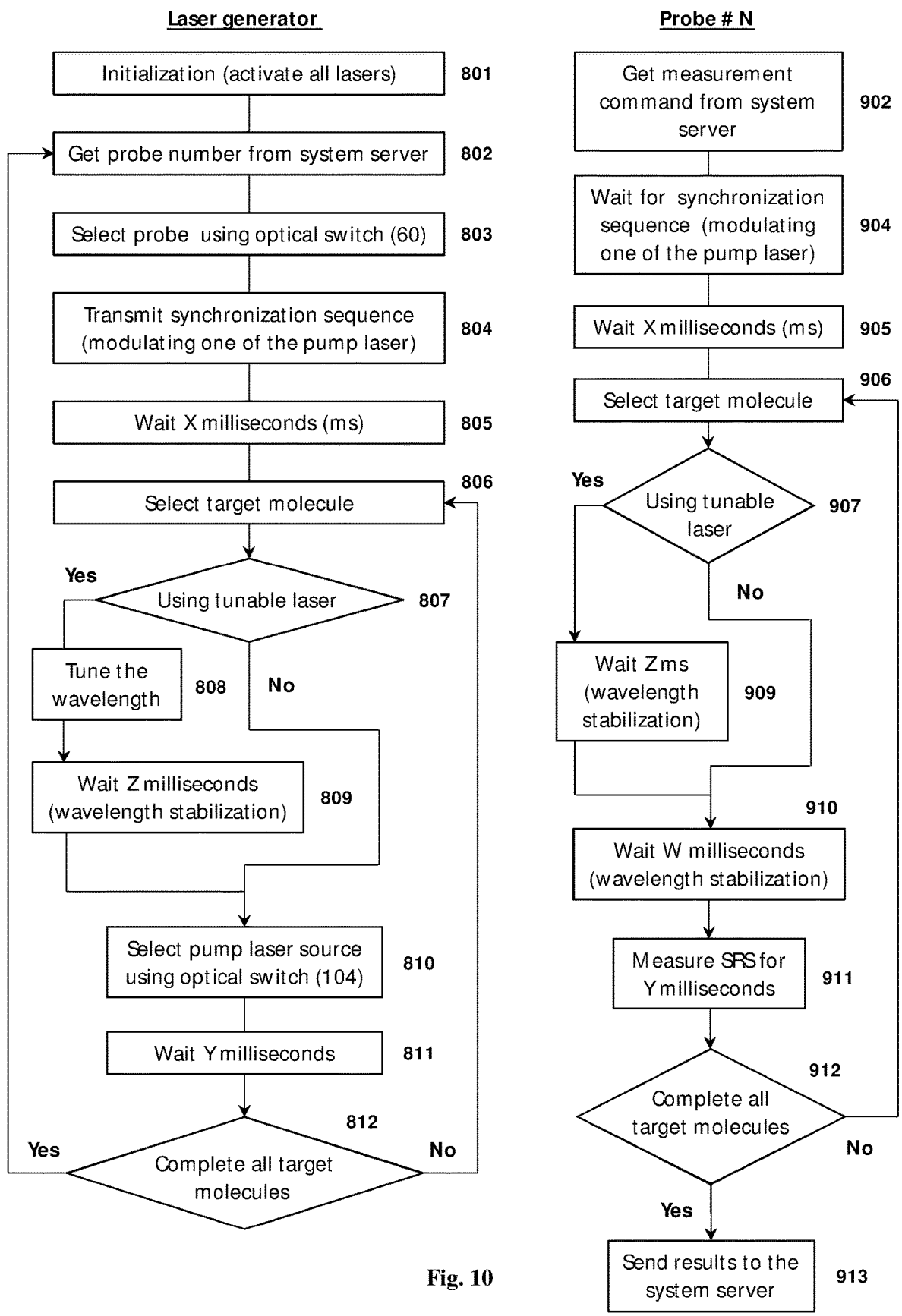
FIG. 10 shows an operational method of the SRS spectroscope of an embodiment.

In a certain embodiment, a method for operating the SRS spectroscope of the present application comprises the following steps shown in FIG. 10:

Step 1: The system server selects a target probe and notifies both devices (802, 902).

Step 2: The laser generator selects a probe (803).

Step 3: This step is to synchronise the timing of both devices and the laser generator transmits the synchronisation sequence modulating one of the pump laser in predefine sequence of laser ON and OFF state (804), the probe receives the laser signal using the "Reference Pump DC" photodiode (904). Once the synchronisation sequence is identified, both devices "recognise" that the measurement sequence will start in X milliseconds after the end of the synchronisation sequence (805, 905).

Step 4: Both devices have the same list of target analytes and select them in the same order (806, 906).

Step 5: The laser generator sets the corresponding wavelength by selecting one of the fixed-wavelength lasers or by tuning the tunable laser (807-810). The probe is waiting for the predefine time W milliseconds, and if the second laser is a tunable laser diode, it will wait for additional Z milliseconds (909, 910).

Step 6: This step is the actual time measurement step at Y milliseconds (for example, in the present prototype system, Y=100 ms that provides—1000 repetition of the Stokes pulses) (811, 911).

Step 7: The steps 806-812 and 906-912 are repeated until all target analytes are measured, in case there are more than one target analyte to measure.

Step 8: Once the above measurements are completed, the laser generator moves to the next probe (812).

Step 9: The probe sends the results to the system server (913).

In a further embodiment, a method for data processing which may be used to generate an SRS spectra using the SRS spectroscope described in the present application, comprises the following steps:

Step 1: Set all hardware values to their initial setup.

Step 2: Measure the spectral data of the samples in detection element contain calibration sample, over a predefined range. This step is performed, for example, as described above but only for the detection elements containing a calibration sample and not for those containing a target sample.

Step 3: Apply one of many known signal-to-noise ratio (SNR) improvement algorithms, utilising the repetitive samples of each measuring point, to generate a calibration sample spectrum.

Step 4: Estimate measurement error by measuring results of the calibration sample and comparing it to expected results thus providing a two dimensional (wavelength and intensity) error value for each spectrum point. The expected results are obtained from a library of spectra stored in the system's DSP/CPU.

Step 5: Calculate parameters for correction of the laser values based on the error estimation calculation determined in Step 4.

Step 6: Calculate physical calibration values for laser hardware (HW), e.g. laser input current, thermo-electric cooler (TEC) setting, etc. Based on these calculations both lasers hardware settings are adjusted inter alia by adjusting power, wavelength, etc., as necessary.

Step 7: Measure spectral data for target sample(s) and the calibration sample(s).

Step 8: Apply one of many known SNR improvement algorithms, utilising the repetitive samples of each measurement point, to generate a spectrum for each target and calibration sample.

Step 9: Estimate measurement error. Intensity and wavelength errors are determined for the target sample results based on the measured calibration sample results and the known values from the stored spectra of the library's calibration spectra.

Step 10: Compare estimated measurement errors from Step 9 to pre-defined limits. If one or more of the estimated measurement errors is above the pre-defined limits, return to Step 5 for physical calibration. If all of the errors are smaller than the predefined limits, continue to Step 11.

Step 11: Calculate error correction parameters using any of many known adaptive calibration algorithms. The error estimation parameters, from Step 8, together with the previous calibration parameters are then used for calculation of the new calibration parameters.

Step 12: Perform database calibration (software only) by modifying each spectrum point of the target sample according to the error correction parameters. Each data point of each target sample is modified in two dimensions according to the relevant correction parameter.

Step 13: Provide a fully processed and calibrated SRS spectrum or calibrated spectral data for each target sample. This spectrum or calibrated spectral data may be exported for further processing or recording. For example, the spectral data of the Raman spectrum obtained may be exported for identification of the target sample by comparing the result to a Raman spectrum library.

Step 14: Check if the last predetermined cycle has been reached.

Step 15: If the last cycle has not been reached, detection elements containing target samples are prepared for the next measurement cycle. For example, a new sample that may contain new materials or the same materials but with different quantities is inserted into the detection element and then proceed to Step 7.

Step 16: If last cycle has been reached in Step 14, terminate the processing.

One of many examples of industrial applications of the SRS spectroscope of an embodiment is the real-time monitoring of natural gas composition through its production and transport chains. The SRS spectroscope of the present application is capable of analysing, for example, the combustion input and output materials, such as natural gas, input air and exhaust, and providing molecular composition of the tested materials with an extremely high resolution of about 10 ppm in no more than 0.1 sec per molecule. This results in the measurement of the gas full composition having, for instance, eight different components, taking about one second. Such extremely fast measurement is achieved by a totally new approach to the SRS implementation, as described above. This new approach is actually the present design of the SRS spectroscope of an embodiment based on re-configuration of commercially available electro-optic components, while compensating for impairments of different components by applying the DSP algorithms to the received signals.

In the above example relating to natural gas, the aforementioned high sensitivity and fast measurements attributed to the SRS spectroscope of an embodiment enable on-line detection of changes in the gas composition, calibration and optimisations of the turbine combustion to accommodate various changes in gas composition at the turbine inlet, thus preventing turbine damage due to sudden gas composition changes and improve electricity generation efficiency. In addition to the power generation market, the SRS spectroscope of the present invention may be used in the oil and gas industry for monitoring composition along the extraction, purification, transportation and supply chains. It may be used in the chemical industry for very accurate, reliable monitoring of production processes. Moreover, the laser generator subsystem of an embodiment may be placed in office environment which is more "friendly" environment than the outdoors.

Thus, the SRS spectroscope of an embodiment may be used as a fully-automatic, low-maintenance (without moving parts and consumables) molecular composition analyser for various industrial outdoor applications in a wide range of extreme conditions, such as corrosive and explosive environments, high and low temperatures, high pressure and high humidity.

While certain features of the present application have been illustrated and described herein, many modifications, substitutions, changes, and equivalents will be apparent to those of ordinary skill in the art. It is, therefore, to be understood that the appended claims are intended to cover all such modifications and changes as fall within the true spirit of the present application.

The invention claimed is:

1. A stimulated Raman scattering (SRS) spectroscope for high-resolution, real-time and on-site industrial molecular analysis of a sample, comprising:
   (a) a laser generator subsystem comprising a first laser capable of generating a first laser beam having a relatively low power, and a second laser capable of generating a second laser beam having a wavelength that matches the input of a passive Q-switch crystal, and transmitting said two laser beams into a passive detection probe subsystem via optical fibres, wherein the spectral difference wavelength between said first laser beam and said passive Q-switch crystal matches the excitation Raman wavelength of a target analyte in said sample;
   (b) at least one passive detection probe subsystem comprising:
      said passive Q-switch crystal, capable of receiving said second laser beam and generating high-power short pulses of a Stokes signal from said second laser beam, and
      a beam combiner unit capable of combining said high-power short pulses of the Stokes signal with said first low-power laser beam into a mixed laser beam, transmitting 5-10% of said mixed laser beam to a receiver subsystem via an optical fibre or through free space optics, transmitting the rest 90-95% of said mixed laser beam into a detection cell containing said sample, and further transmitting the resulting laser beam to said receiver subsystem via another optical fibre or through free space optics;
   (c) the receiver subsystem capable of capturing said mixed laser beam and said resulting laser beam onto an optical frontend connected to an analogue frontend, converting said two laser beams to an analogue signal at said analogue frontend, converting said analogue signal to a digital signal, improving a signal-to-noise ratio, generating the SRS data for said sample, and outputting said SRS data to a computing unit; and
   (d) the computing unit capable of collecting, analysing and displaying said SRS data in a readable format, controlling said SRS spectroscope, calculating molecular composition of the sample and concentration of said target analyte in said sample, obtained from said SRS data using a concentration algorithm, and transmitting the obtained calculation results to a process control host system for improving and optimising the process via real-time close loops or via massive data collection and big data analysis;
   wherein
      (i) said laser generator subsystem is distant from said passive detection probe system, said distance is determined by safety and design requirements in analysis of said sample;
      (ii) said passive detection probe subsystem is purely optical and contains no electronic components;
      (iii) said high-power short pulses of the Stokes signal are generated using said passive Q-switch crystal in a close proximity to said detection cell, and filtered out at the exit from said detection cell;
      (iv) said receiver subsystem is asynchronous with respect to said laser generator subsystem, detecting the SRS signal at a pre-defined moment of time independent of capturing said laser beams, thereby improving the overall signal-to-noise ratio and obviating the need for signal transduction from said laser generator subsystem;
      (v) said high-power Stokes signal is used as an acquisition clock for detection (clocking) of said SRS signal and removal of a fundamental jitter, thereby obviating the need for tracking said jitter in said SRS spectroscope; and
      (vi) said SRS data is collected as a lost signal in said low-power pump signal, which is symmetric to said high-power Stokes signal, thereby obviating the need for synchronisation of said signals.

2. The SRS spectroscope of claim 1, wherein said first laser is one or more tunable laser diodes or a combination of one or more tunable laser diodes and one or more fixed-wavelength laser diodes.

3. The SRS spectroscope of claim 2 further comprising a central processing unit capable of tuning said tunable laser diode to a predefine set of wavelengths.

4. The SRS spectroscope of claim 1, wherein said first laser is an array of fixed-wavelength laser diodes, capable of generating laser beams having different wavelengths and being activated in a predefine sequence for selecting a particular fixed-wavelength laser diode from said array for generating said first laser beam, wherein at a certain time, only one of said fixed-wavelength laser diodes is selected to transmit said first laser beam into said passive detection probe subsystem.

5. The SRS spectroscope of claim 4 further comprising an optical switch capable of fast switching between said fixed-wavelength laser diodes in said array in a predefine sequence.

6. The SRS spectroscope of claim 5 further comprising a central processing unit capable of controlling said optical switch and selecting a particular fixed-wavelength laser diode from said array for generating said first laser beam, wherein the spectral difference wavelength between said first laser beam and the passive Q-switch crystal matches the excitation Raman wavelength of a target analyte in the sample.

7. The SRS spectroscope of claim 6 further comprising an additional optical switch capable of directing said generated first laser beam into the passive detection probe subsystem.

8. The SRS spectroscope of claim 5 further comprising an additional optical switch capable of directing said generated first laser beam into the passive detection probe subsystem.

9. The SRS spectroscope of claim 1, comprising more than one passive detection probe subsystem for testing more than one sample, and further comprising more than one optical switches capable of switching between said passive detection probe subsystems and selecting a particular passive detection probe subsystem for conducting the test on a specific target analyte.

10. The SRS spectroscope of claim 9, wherein one of said passive detection probe subsystems is used for calibration.

11. The SRS spectroscope of claim 1, wherein said passive detection probe subsystem comprises:
   a passive Q-switch crystal capable of receiving said second laser beam and generating high-power short pulses of the Stokes signal from said second laser beam;
   a beam combiner unit capable of combining said high-power short pulses of said Stokes signal with said first laser beam into a mixed laser beam, transmitting 5-10% of said mixed laser beam (a reference laser beam) directly to the optical frontend of the receiver subsystem via a multi-mode optical fibre and transmitting the rest 90-95% of said mixed laser beam to a detection cell containing said sample; and
   the detection cell connected to the optical frontend of the receiver subsystem, and capable of receiving 90-95% of said mixed laser beam and said sample of the target analyte from an external source, wherein said detection cell is sequentially irradiated by 90-95% of said mixed laser beam.

12. The SRS spectroscope of claim 1, wherein said detection cell comprises a multi-pass unit improving detection sensitivity by increasing the total optical path length that travels through the sample volume.

13. The SRS spectroscope of claim 1, wherein said detection cell comprises a single-pass unit.

14. The SRS spectroscope of claim 1, wherein said receiver subsystem comprises:
   the optical frontend connected via multi-mode optical fibres or optically through space to said detection cell, and containing a plurality of photodetectors adapted and configured for receiving said mixed laser beam and said resulting laser beam, splitting said mixed and resulting laser beams into pump and Stokes laser beams and directing said pump and Stokes laser beams to the analogue frontend;
   the analogue frontend comprising photodiodes capable of converting said pump and Stokes laser beams into corresponding analogue signals and directly providing said analogue signals to a digital board;
   the digital board comprising a plurality of analogue-to-digital convertors (ADCs) for converting said analogue signals to digital signals, one or more analogue filters for analogue processing, a programmable gain control (PGC) circuit, and one or more digital signal converters for converting the Stokes pulses to the digital signals and using said digital signals as triggers for said ADCs; and
   a computing unit comprising a digital signal processor (DSP) and/or central processing unit (CPU) capable of receiving the digital signals from said ADCs, processing and calibrating them, and generating a SRS spectrum from said processed digital signals.

15. The SRS spectroscope of claim 1, wherein the distance between said laser generator subsystem and said passive detection probe system is in the range of 10-500 m and the distance between said detection cell and said receiver subsystem is in the range of 10 cm to 50 m.

16. Use of a passive Q-switch crystal in the SRS spectroscope of claim 1 for generating high-power short pulses of the Stokes signal, in a close proximity to the detection cell.

17. The SRS spectroscope of claim 1 for use in real-time molecular level monitoring, real-time measurement of industrial processes, real-time feedback control of these processes, temperature measurement of industrial processes for real-time molecular level monitoring, real-time measurement of environmental parameters, and detection of biomarkers in medical applications.

18. The SRS spectroscope of claim 1 for use in generating the low-power pump signal having weak intensity $I_p$ and the high-power Stokes signal having strong intensity $I_s$, such that the product of the intensities $I_p \times I_s$ creates a detectable SRS signal $\Delta I_p$ expressed as a loss in the intensity of the pump signal $I_p$, and the extraction of said SRS signal $\Delta I_p$ from said pump signal $I_p$ is carried out using standard components, algorithms and processing solutions for extraction of signals out of laser noise and further amplification using lock-in amplifiers.

19. A method for operating the SRS spectroscope of claim 1, comprising the following steps:
   selecting, via the computing unit, a target probe and notifying the laser generator subsystem and the corresponding passive probe detection subsystem;
   selecting, via the laser generator, the passive probe detection subsystem;
   synchronizing timing of both the laser generator subsystem and the passive probe detection subsystem, wherein the laser generator transmits the synchronisation sequence modulating one of the pump laser in a pre-defined sequence of the laser's ON and OFF states, and the probe receives the laser signal;
   starting the measurement sequence at a certain moment of time after the end of the synchronisation sequence, wherein said moment of time is now recognized by the laser generator subsystem and the passive probe detection subsystem as result of the synchronisation sequence, wherein the laser generator subsystem and the passive probe detection subsystem have the same list of target analytes select them for measurements in the same order;
   setting, via the laser generator subsystem, the corresponding wavelength by selecting one of the fixed-wavelength lasers or by tuning the tunable laser, and the passive probe detection subsystem is waiting for a pre-defined moment of time, wherein in case the second laser is a tunable laser diode, it will wait for an additional pre-defined period of time;
   conducting, via the passive probe detection subsystem, the SRS measurements for a pre-defined period of time;
   repeating the previous steps until all target analytes are measured, if there are more than one target analyte to measure;
   moving, via the laser generator subsystem, to a next target probe; and
   sending, via the passive probe detection subsystem, the results to the computing unit.

* * * * *